(12) United States Patent
Robert

(10) Patent No.: US 7,626,529 B2
(45) Date of Patent: Dec. 1, 2009

(54) METHOD FOR DIGITIZING AN ANALOG QUANTITY, DIGITIZING DEVICE IMPLEMENTING SAID METHOD, AND ELECTROMAGNETIC RADIATION DETECTOR INTEGRATING SUCH A DEVICE

(75) Inventor: Patrick Robert, Reaumont (FR)

(73) Assignee: ULIS, Veurey Voroize (FR)

( * ) Notice: Subject to any disclaimer, the term of this patent is extended or adjusted under 35 U.S.C. 154(b) by 193 days.

(21) Appl. No.: 11/970,730

(22) Filed: Jan. 8, 2008

(65) Prior Publication Data

US 2008/0174464 A1 Jul. 24, 2008

(30) Foreign Application Priority Data

Jan. 23, 2007 (FR) ................................. 07 52815

(51) Int. Cl.
*H03M 1/12* (2006.01)
(52) U.S. Cl. ................. 341/155; 341/118; 341/120; 341/143; 341/156
(58) Field of Classification Search ............... 341/118, 341/120, 143, 155, 172
See application file for complete search history.

(56) References Cited

U.S. PATENT DOCUMENTS

| | | | |
|---|---|---|---|
| 4,536,744 A | 8/1985 | Brown | |
| 4,568,913 A | 2/1986 | Evans | |
| 4,965,578 A | 10/1990 | Poujois | |
| 4,973,976 A * | 11/1990 | Lee et al. | 341/141 |
| 5,117,227 A * | 5/1992 | Goeke | 341/166 |
| 5,329,282 A * | 7/1994 | Jackson | 341/143 |
| 5,727,023 A * | 3/1998 | Dent | 375/244 |
| 6,075,478 A * | 6/2000 | Abe | 341/155 |
| 6,100,834 A * | 8/2000 | Lewyn | 341/155 |
| 6,380,874 B1 * | 4/2002 | Knudsen | 341/118 |
| 6,384,760 B1 | 5/2002 | Fuhrman | |
| 6,507,302 B2 * | 1/2003 | Sakimura | 341/143 |
| 6,642,874 B1 * | 11/2003 | Lin et al. | 341/143 |
| 6,909,393 B2 * | 6/2005 | Atriss et al. | 341/163 |
| 7,064,694 B1 | 6/2006 | Male et al. | |
| 7,362,247 B2 * | 4/2008 | Arias et al. | 341/120 |
| 7,479,910 B1 * | 1/2009 | Heinks et al. | 341/143 |
| 7,495,589 B1 * | 2/2009 | Trifonov et al. | 341/118 |
| 2004/0034499 A1 | 2/2004 | Regier | |

FOREIGN PATENT DOCUMENTS

EP 0 313 460 A1 4/1989

* cited by examiner

*Primary Examiner*—Linh V Nguyen
(74) *Attorney, Agent, or Firm*—Burr & Brown

(57) ABSTRACT

A method of digitizing an analog quantity from an electromagnetic radiation detector including a matrix of juxtaposed elementary sensors, including, for each line or column of the matrix, the steps of: integrating the analog quantity using an integrator stage; converting the integrated analog quantity to a first numerical value via a binary counter and a memory element connected to the output of a comparator stage; converting the first numerical value to an analog signal via an analog-to-digital converter; subtracting the analog signal from the analog quantity to be digitized; amplifying the signal resulting from the subtraction with a gain representing the first numerical value; integrating to produce a second numerical value proportional to the analog signal thereby amplified and forming a second binary number representing the least significant bits; and adding said first and second numerical values to form a number representative of the analog quantity to be integrated.

12 Claims, 3 Drawing Sheets

METHOD FOR DIGITIZING AN ANALOG QUANTITY, DIGITIZING DEVICE IMPLEMENTING SAID METHOD, AND ELECTROMAGNETIC RADIATION DETECTOR INTEGRATING SUCH A DEVICE

FIELD OF THE INVENTION

The present invention relates to a method for carrying out the conversion of analog quantities to digital signals, said quantities being in particular produced by an electromagnetic radiation detector. The present invention also relates to a device for carrying out such a conversion.

The present invention therefore relates more generally to the field of electromagnetic radiation detectors, and to the construction and operation of their readout circuit.

PRIOR ART

In a manner known per se, electromagnetic radiation detectors are composed of a plurality of juxtaposed elementary sensors in order to form a matrix having a number of lines and columns. The interactions of the incident electromagnetic radiation with these elementary sensors, also called pixels, generate variations of an electrical quantity, corresponding to the energy flux of the incident radiation.

A microbolometric infrared imaging retina is one particular example of such a detector. In this case, the detector operates like a thermistance sensitive to heat radiation, which is measured by the integration of the current passing through it under the action of a given bias voltage during a given period, by a readout circuit provided at the elementary sensors.

The integrated charges thereby form analog signals or quantities. To simplify the electrical interfaces with the electronics external to the readout circuit, these analog quantities are converted to digital signals, in order to reconstitute a two-dimensional image representative of the scene observed.

It is known that the performance of a detector, hence the quality of the data it delivers (digital images for example), depends in particular on the characteristics of the conversion to digital signals of the analog quantities representative of the interactions between the incident radiation and the elementary sensors. From the prior art, three principles are essentially known for converting analog quantities to digital signals, integrated in the readout circuit.

Firstly, detectors exist for which a single conversion device, or converter, successively digitizes the analog data transmitted by each of the sensors constituting the matrix. In general, the reading of such detectors is made sequentially by scanning lines, and then columns. In this case, the duration or analog-to-digital conversion time is at most equal to the readout time of an elementary sensor of the detection matrix.

According to a second conversion principle, each column of the detector is equipped with a conversion device. The analog-to-digital conversion time is then at most equal to the readout time of a line of the detector.

According to a third conversion principle, each sensor of the detector is equipped with such a conversion device. The analog-to-digital conversion time is then at most equal to the cumulative readout time of all the sensors of the matrix.

Among these various solutions, the choice of the conversion principle, and hence of the device or the method, can be made according to criteria such as the conversion time of the conversion device, its resolution, its size, its power consumption, etc.

In particular, in the second solution in which each column of the matrix has its own conversion device, the size thereof must be reduced to the repetition step between two adjacent columns of pixels, and in the third case, the size must be reduced in both dimensions to the repetition step of the elementary pixel. The repetition step is in fact the distance between two adjacent sensors and generally corresponds to the size of a pixel of the final digital image.

Furthermore, when use is made of a plurality of high resolution conversion devices on the same circuit, each of the conversion devices may be sensitive to the electrical disturbances generated by the neighboring conversion devices. In fact, the higher the resolution of a converter, the smaller the voltage difference corresponding to two successive digital values, and in consequence, the more sensitive it is to external disturbances. This sensitivity is due in particular to the construction of the conversion devices, which are not electrically independent, but on the contrary, share the same substrate and the same frames or the same electric power sources.

On the other hand, the choice of the architecture of the conversion device, that is the number, positioning and arrangement of the electronic components, must be defined in order to minimize the total power consumption of the readout circuit. In fact, besides the fact that the infrared imaging concerns onboard electronic systems, in which power storage is a very important requirement, it is also important to limit the dissipation of the focal plane, because the detector matrix is inherently sensitive to the thermal environment.

Among the conversion principles implemented in the architectures of converters of the prior art, mention can be made of the principle of what is called "voltage-time conversion". This method consists in integrating over time an analog quantity, voltage, until it reaches a reference value. The integration is interrupted when this reference value is reached, marking the end of the actual integration phase. In the case of an integration carried out by a conventional single ramp single slope integrator array, the time taken by this analog quantity to reach this reference value is directly proportional to the value of this analog quantity.

In fact, since the integrator assembly has a single slope, the variation in the analog quantity over the integration time is linear. In a manner known per se, it therefore suffices to measure the integration time as a number of counting time periods, to convert the value of this analog quantity, that is to digitize it. Thus, the simple counting of the number of pulses delivered by a reference clock measuring this duration directly supplies the numerical value of the integrated analog quantity.

To determine the end of the counting, a differential construction compares the analog quantity to the reference value; when their difference is cancelled and changes sign, this comparator transmits a signal to fix the current digital value of the counter and thereby determine the value of the analog quantity.

In practice and in a manner known per se, when the counter receives a pulse from the reference clock, it increments a binary number by one unit. In consequence, the number of counter bits necessary depends on the resolution required of the conversion device, that is, the number of quantification steps used to sample the maximum analog quantity.

Thus, for a conversion device using $2^N$ quantification steps to sample the analog quantity to be integrated, the counter must comprise N counting bits. The conversion time of an analog quantity by such a converter is then between zero and a maximum of $2^N/f_h$, where $f_h$ is the clock frequency. Thus, if P represents the number of pulses delivered by the clock until the analog quantity reaches the reference value of the comparator stage, P is equal to the digital value of the signal and the conversion time of the signal is $P/f_h$.

However, such a conversion method has drawbacks that are liable to limit the performance of such an analog-to-digital converter. Thus, in order to increase its resolution and/or decrease its conversion time, a clock delivering pulses at a higher frequency must be used. In fact, on the one hand, there is a technological limit to the maximum clock frequency, and on the other, it is well known that the power consumption of the converter increases with this frequency and may thus become excessive for certain applications.

To solve this problem, one solution of the prior art consists in increasing the number of integration slopes of the converter, and hence in designing single ramp and multiple slope conversion devices. Thus, in the case of a single ramp and double slope conversion device, the first integration slope is used to define the number P corresponding to the value of the input analog quantity with a high quantification step. Conversely, the second slope is used to convert, with a fine quantification step, the remainder defined by the difference between the input analog value and the high analog value corresponding exactly to the number P. This remainder or residue corresponds to a low analog quantity.

In general, a distinction is made between a first numerical value coded by bits called "most significant" bits and a second numerical value coded by bits called "least significant" bits. Through an abuse of language, the integrated analog quantities are designated in the same way (most significant and least significant) as the numerical values (bits) which represent them after the digitization step. In the context of the present patent, numerical value means the binary numbers composed of "0" and "1".

Thus, the number N of bits on the converter is broken down into two "sub-numbers", that is, a number corresponding to the most significant bits denoted $N_{MSB}$ (MSB for "Most Significant Bits"), and a number corresponding to the least significant bits denoted $N_{LSB}$ (LSB for "Least Significant Bits"). By definition, the sum of the two numbers $N_{MSB}$ and $N_{LSB}$ is N, that is, the total number of bits possessed by the converter device.

In a manner known per se, a two slope integration method serves to reduce the conversion time for a detector. In fact, depending on the value of the analog quantity to be integrated, this time varies between zero and a maximum of $(2^{N_{MSB}} + 2^{N_{LSB}})/f_h$. This time is therefore necessarily shorter than the maximum time of $2^N/f_h$ necessary for a single slope conversion device.

FIG. 1 shows a graph illustrating a single ramp and double slope conversion method of the prior art. In this graph, the x-axis shows the time t, and the y-axis shows the output voltage $V_S$, that is, an analog quantity generated by the interactions between sensors and radiations, during its processing by an integrator circuit.

According to such a single ramp double slope conversion method, the curve 101 shows the integration of an input voltage $V_E$ entering the integrator circuit. The curve 101 comprises a slope called high 102 and a slope called low 103. In the context of the present patent, "high" means a slope whereof the slope factor has a high absolute value, while "low" means a slope whereof the slope factor has a low absolute value. Thus, the high slope 102 represents a phase of integration of the most significant bits (high analog quantities), while the low slope 103 represents a phase of integration of the least significant bits (low analog quantities).

By definition, each integration phase takes place during a time interval bounded by two instants which respectively form the lower bound and the upper bound of this time interval. The first integration phase $t_0$-$t_1$ (high slope 102) is interrupted, synchronously with the clock frequency $f_h$, when the integrated voltage $V_E$ has exceeded a reference value $V_{ref}$, that is, when the difference between the integrated voltage $V_E$ and the reference value $V_{ref}$ is cancelled. This condition thereby defines the upper bound $t_1$ of the time interval of the first integration phase $t_0$-$t_1$.

According to this conversion method, the second integration phase (low slope 103) begins upon the end of the first integration phase. In other words, the lower bound t, of the second time interval $t_1$-$t_2$ is substantially merged with the upper bound t, of the first time interval $t_0$-$t_1$. Then, this second integration phase is interrupted when the sum of the voltages integrated during the two integration phases exceeds the value of the input voltage $V_E$.

As stated above, a time is measured by the number of pulses delivered by a reference clock (not shown). Since the curves 102 and 103 are line segments, the clock pulses therefore represent as many quantification steps of the integrated voltage, and therefore, this integration voltage itself. Hence, the name attributed to this type of "voltage-time" analog-to-digital conversion method.

According to this method, each of the slopes, high 102 or low 103, serves to code a number respectively representing the most significant bits (MSB) and the least significant bits (LSB). These numbers thereby serve to reconstitute an image representative of the scene observed, as a binary digital quantity. Thus, an analog quantity can be converted into a digital signal with a resolution of at least 12 bits and a conversion time of 60 μs.

In fact, this conversion time is compatible with a scanning of 60 images/s for a detector conventionally composed of 320×240 lines. On the contrary, a single slope "voltage-time" conversion method would give a conversion time that is too long for such a resolution. In the present context, resolution of the converter means the capacity of the converter to distinguish between two adjacent integrated voltages.

This resolution is selected in particular according to the application desired for the detector. Obviously, the higher this resolution is selected, the longer the analog-to-digital conversion time.

In fact, the resolution does not depend on the quantification of the quantity to be integrated. In a manner known per se, this quantification step has the value of the dynamic range of the detector divided by $2^N$ (number 2 raised to the power of the number N of bits coding the maximum value of this dynamic range).

In practice, to carry out this conversion method, each column of a matrix detector is equipped with a conversion device or analog-to-digital converter. FIG. 2 shows such a prior art converter. It comprises in succession an integrator stage 210, a differential or comparator stage 220, a control stage 230 and a counting stage 240.

The integrator stage 210 is designed to integrate the input voltage $V_E$ generated by a column of elementary sensors. The differential stage 220 serves to compare the integrated voltage $V_E$ with a reference value $V_{ref}$ in order to determine a first integration phase from $t_0$ to $t_1$, denoted $t_0$-$t_1$ and a second integration phase from $t_1$ to $t_2$, denoted $t_1$-$t_2$. The control stage 230 serves to control the integrator stage 210, in order to carry out two integration phases in succession, at high slope 102 and at low slope 103. Finally, the counting stage 240 serves to count the number of pulses delivered by a clock 250 during each of these integration phases $t_0$-$t_1$ then $t_1$-$t_2$ and, hence, to quantify the integrated voltage $V_E$.

In a manner known per se, the integrator stage 210 may comprise an input resistance 211 connected to the reversing input 215 of an operational amplifier 214 and a capacitor 212, mounted in parallel between the reversing input 215 and the output 216 of the operational amplifier 214. The capacitor 212 serves to carry out the integration of the input analog quantity $V_E$.

The comparison stage 220 essentially comprises two comparators 221, 223, whereof the non-reversing inputs 222, 224 are connected respectively to the reference voltages $V_{ref1}$ and $V_{ref2}$. The voltage $V_E$ integrated by the integrator stage 210 applied to the reversing inputs of the comparators 221, 223 can thus be compared with these two reference voltages. As stated above, this "comparison" or measurement of their difference serves to define the upper bounds $t_1$ then $t_2$ of the high slope 102 and low slope 103 integration phases.

Furthermore, two switches 232 and 233 are mounted in parallel in the control stage in order to select one or the other of the power sources I and I/2B for discharging the integration capacitor 212. Switch means any device suitable for switching a circuit from an open status to a closed status and vice versa. In practice, transistors can constitute switches. In doing so, the control stage 230 determines the gain of each of the two integration phases 102 and 103, which is, in a manner known per se, inversely proportional to the capacitance of the integrator capacitor 212.

Furthermore, when it receives the "cancellation" signals transmitted by the comparator stage, the logic control circuit 231, by transmitting an appropriate signal at its outputs 234, 235, stops the counters 241, 242 of the pulses delivered by the reference clock.

In operation, when the difference between the integrated voltage $V_E$ and the reference voltage $V_{ref}$ is canceled and then changes sign, the comparator 221 transmits a "cancellation" signal to a logic control circuit 231 of the control stage 230. This logic circuit 231 in turn controls, synchronously with the frequency $f_h$ of the clock 250, two counters 241 and 242.

During the time interval $t_0$-$t_1$, the counter 241 quantifies the most significant bits making up the integrated analog quantity. Then, during the time interval $t_1$-$t_2$, the counter 242 quantifies the least significant bits making up said integrated analog quantity. The most significant and least significant bits can then be added in a binary manner using a component 260, in order to form a binary number representing the value of the integrated analog quantity.

The electrical architecture described above in relation to the converter in FIG. 1 thus has the electronic components necessary for implementing this prior art conversion method. In doing so, when this type of converter is used in a matrix detector having a number C of columns, the following is necessary to carry out the conversions:

C integrator circuits,

2.C comparator circuits, and 2.C counters.

In fact, the larger the number of electronic components, the higher their total power consumption and the hotter the circuits become. Furthermore, the size occupied by these electronic components limits the fineness of the repetition step between two adjacent columns of sensors. Moreover, the manufacturing capacities are commensurately lower, and hence the manufacturing costs are obviously higher with a larger number of electronic components in a converter.

This two slope conversion method therefore serves to reduce the time for converting an analog quantity, since the conversion time is:

$t_{conv1}=(2^B+2^M)/f_h$, where: B and M respectively represent the numbers of most significant bits and least significant bits, and $1/f_h$ the duration of a sampling period or of a clock pulse $T_h$.

For its part, the single slope conversion system requires a conversion time of:

$t_{conv2}=2^N/f_h$, where N is the number B+M of total bits.

It is easy to confirm that $t_{cnv1}<t_{conv2}$.

However, the conversion methods and devices operating the two integration slopes are currently faced with several difficulties which limit their digitization performance.

Firstly, since each column of the matrix detector has its own conversion device, the size thereof limits the reduction of the repetition step, hence the miniaturization of the detector. In fact, a prior art conversion device like the one shown in FIG. 2 requires the installation of two comparators and two counters to code the integrated analog quantity. The installation of these double components therefore increases the size of the conversion device, for example, in comparison with the size of a single ramp conversion device.

Moreover, each comparator 221 and 223 has its own switching threshold. In fact, the voltage offset between the thresholds of these two comparators is very low, so that it is difficult to generate reference voltages $V_{ref1}$ and $V_{ref2}$ with sufficient accuracy to digitize the least significant bits.

Thus for example, when the first integration phase $t_0$-$t_1$ quantifies the analog quantity to be integrated using a number of eight bits called most significant bits, the voltage offset between the thresholds of the two comparators has the value of the total dynamic range of the detector divided by $2^8$. The smallness of this offset therefore requires high accuracy in generating the reference voltages $V_{ref1}$ and $V_{ref2}$, with the condition $V_{ref2}>V_{ref1}$ Furthermore, if we take account of the voltage offset of the two comparators, we may find ourselves in the case in which, having opposite signs, the condition:

$V_{ref2}+V_{off2}>V_{ref1}+V_{off1}$ is not satisfied.

Another difficulty arises from the fact that the comparator 223 designed to digitize the least significant bits operates over a restricted voltage range, making it very sensitive to noise and to electrical disturbances occurring in the circuit, particularly during the switching of the switches 232 and 233. The quantification accuracy required for the operational amplifier 223 must be lower than the least significant bits of the converter. The maximum tolerated error must be lower than the total dynamic range of the detector divided by $2^N$, where N is the resolution of the conversion device. It is found that for high N, this error is very low.

Moreover, the use of two different operational comparator amplifiers 221 and 223 for the two ramps 102 and 103 of different slopes, that is, a low slope and a high slope, leads to a different hysteresis for each comparator. This difference in hysteresis causes an irregularity or a nonlinearity in the slope break occurring at time $t_1$.

Furthermore, the ratio between the two discharge currents I and I/2B must also be defined sufficiently accurately without noise to avoid a nonlinearity. In particular, in the case of the conversion at the end of each column, a problem of pairing is encountered between transistor power sources when the number of columns is high.

Solutions are available in the prior art to compensate for the voltage offset of an amplifier mounted as a comparator and to correct the differences in gain between high and low slopes. It is possible, for example, to use a self-calibration system integrated with the conversion device and comprising additional electronic components such as a potentiometer.

However, these additional electronic components complicate the assembly and above all, increase the area occupied by the conversion device. In fact, such a converter must be suitable for accommodation at the end of each column, on a small area, of which one dimension is defined by the pixel repetition step, which is typically between 15 µm and 45 µm and which obviously must be minimized.

It may also be observed that the two point correction principle, commonly employed in the field of infrared imaging, serves to correct the gain and to compensate for the voltage offset of each pixel. However, this correction has no effect on the offset occurring at the slope break of a double ramp converter, as shown at time $t_1$ in FIG. 1, that is, this correction has no effect on the linearity errors.

It is the object of the present invention to avoid the difficulties encountered by the conversion methods and devices of the prior art, without necessarily increasing the area occupied by such a converter.

SUMMARY OF THE INVENTION

The present invention therefore relates to a method and a device for converting analog quantities to digital signals, which serve to substantially improve the performance of the methods and devices of the prior art. The present invention is aimed in particular to increase the accuracy of the conversion while decreasing the number of electronic components, their power consumption, their size, and the production cost of an analog-to-digital converter, compared with the converters of the prior art.

A primary object of the invention is a method for analog-to-digital conversion enabling an accurate and repeatable conversion of an analog quantity to be integrated. Such a method is suitable for digitizing an analog quantity produced by a detector of electromagnetic radiation, in particular infrared radiation. Said detector comprises a matrix of juxtaposed elementary sensors, whose interactions with the radiation generate the analog quantity to be integrated. According to the invention, said method comprises the steps consisting, for each line or for each column of the matrix:

- in carrying out a first integration phase of said analog quantity over a first time interval using an integrator stage;
- in ordering the interruption of said first integration phase via a comparator stage whereof one input is connected to the output of said integrator stage and the other input to a reference circuit delivering a reference value;
- in converting the analog quantity thereby integrated to a first numerical value via a binary counter connected to the output of said comparator stage;
- in storing said first numerical value in the form of a first binary number representing the most significant bits;
- in converting said first numerical value thereby obtained to an analog signal similar to the analog quantity to be digitized via an analog-to-digital converter;
- in subtracting said analog signal from said analog quantity to be digitized;
- in amplifying the signal resulting from said subtraction with a gain representing said first numerical value;
- in carrying out a second integration phase using said integrator stage, in order to produce a second numerical value proportional to the analog signal thereby amplified and forming a second binary number representing the least significant bits;
- in adding said first and second numerical values in order to form a number representative of said analog quantity to be integrated.

Thus, the digitization of the analog quantity to be integrated is broken down into two integration phases (two slopes), for the most significant bits and the least significant bits respectively, thereby serving to digitize the analog quantity rapidly, while using a single comparator. During the second integration phase, the residue to be integrated is evaluated by ignoring the value of the most significant bits, converted to analog, from the analog quantity to be integrated. Moreover, the analog signal representing the least significant bits is amplified with a gain which serves to increase the accuracy, that is, decrease the maximum error, of the second integration phase.

In practice, the gain may have the value of the number two raised to a power equal to the number of bits of the first numerical value.

Thus, the amplification of the residue of the analog quantity to be integrated therefore serves to decrease the maximum error of the second integration phase, hence to decrease the constraint on the accuracy of this analog-to-digital converter.

In practice, the first numerical value may be increased by one least significant bit before said conversion step, in order to correct the voltage offset presented by the comparator stage.

This feature of the method according to the invention therefore serves to compensate for the voltage offset presented by the operational amplifier of the comparator stage.

According to a particular embodiment of the invention, the integrator stage may comprise a capacitor and the method may comprise the steps consisting:

- in charging said capacitor with the analog quantity to be converted;
- in discharging said capacitor under a constant high intensity current during the first integration phase;
- in recharging said capacitor with a voltage depending on the difference between the analog quantity to be integrated and the result of the first conversion phase;
- in discharging said capacitor under a constant low intensity current during the second integration phase.

The adjectives "high" and "low" indicate a relative concept. In fact, in practice, the strength of the low current can be selected as equal to the ratio of the strength of the high current to the number 2 raised to a power equal to the number of bits of the first numerical value. For example, if this first numerical value is 8 bits, the low intensity has the value of $\frac{1}{256}^{th}$ of the high intensity. Such discharge currents serve to define sufficient slopes for obtaining good accuracy during each of the integration phases. Moreover, since the discharges are carried out at constant current, a direct relationship is established between voltage and time.

In practice, the reference value can be determined as a function of the sensitivity range of the detector.

This feature serves to optimize the mean of the conversion times of all the analog quantities for the dynamic range of detectors selected.

Moreover, the invention relates to a device for digitizing an analog quantity issuing from an electromagnetic radiation detector. According to the invention, said device comprises for each column of the matrix:

- an integrator stage comprising an operational amplifier, at least one capacitor and an electrically controllable switching device serving to initialize said capacitor connected in parallel between the output and the reversing input of said operational amplifier, said integrator stage being suitable for integrating said analog quantity when said switching device is open;
- a comparator stage comprising a single operational amplifier, and whereof one input is connected to the output of said integrator stage and the other input is connected to a reference circuit delivering a reference value;
- a binary counter connected to the output of said comparator stage and suitable for determining a first numerical value proportional to said integrated analog quantity; however, said binary counter may be offset and common to all the columns, allowing for a gain in terms of area and power consumption;

a digital-to-analog feedback circuit of said counter and comprising, in series:
   a converter suitable for converting said first numerical value to an analog signal similar to said analog quantity to be digitized,
   means for subtracting said analog signal from said analog quantity to be digitized,
   and means for amplifying the signal resulting from said subtraction with a gain depending on the number of bits of said first numerical value,
the output of said reverse feedback circuit being connected to the input of said integrator stage, so that the latter produces a second numerical value proportional to the analog signal thereby amplified;
means for storing the first and second numerical values resulting from the two conversion phases;
means for adding said first and second numerical values in order to form a number representative of said analog quantity to be integrated.

In other words, the analog-to-digital converter of the present invention comprises a single operational integrator amplifier and a single operational comparator amplifier. Furthermore, it comprises an analog-to-digital reverse feedback circuit serving to isolate, in the integrated analog quantity, the residual most significant bits, to convert said value to an analog quantity, to subtract it from the initial analog signal, and then to amplify said weak signal in order to increase the accuracy and repeatability of the digitization.

In practice, the electronic component of the integrator stage is a capacitor. Such a component is in fact suitable for conveniently carrying out the integration of an analog quantity.

According to a practical embodiment of the invention, the storage means may comprise a locking circuit memory, better known in the technical field considered as a "latch", connected to the output of the binary counter. Such a memory has the advantage of occupying a small area.

Also in a practical manner, the analog-to-digital reverse feedback circuit comprises a decoding system and a plurality of capacitors mounted in parallel and individually switchable using switches controlled by said decoding system.

Such a reverse feedback circuit serves to carry out the steps leading to the second integration phase while occupying a limited space.

Furthermore, the invention also relates to a detector of electromagnetic radiation, in particular infrared, comprising a matrix of juxtaposed elementary sensors and a device as previously described.

The subject of the invention is thereby a complete detector suitable for receiving an electromagnetic radiation and then for converting it to digital signals.

In practice, the matrix of this detector may have a single line or a single column.

Moreover, the elementary sensors may be bolometers. This serves to produce thermal images of objects using an instrument operating at ambient temperature.

BRIEF DESCRIPTION OF THE DRAWINGS

The invention and its advantages also appear from the description of the particular embodiments illustrated by the figures, provided at examples and nonlimiting, in which.

EMBODIMENTS OF THE INVENTION

Figure 1:
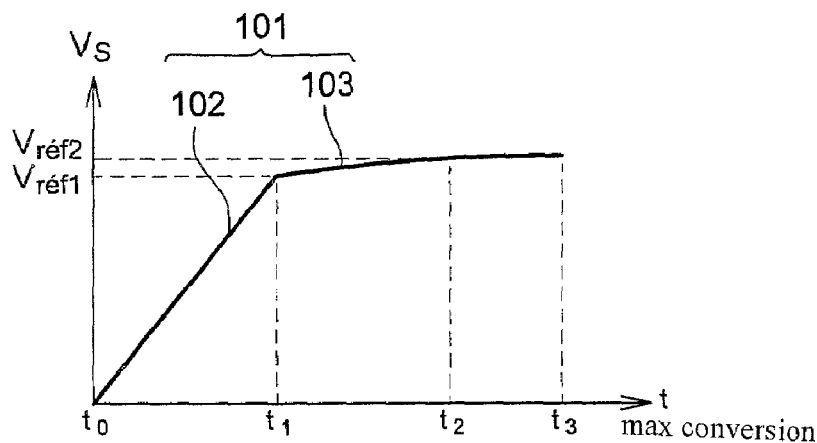
FIG. 1 is a schematic representation of a voltage/time graph, showing a conversion method of the prior art. This figure has already been described in relation to the prior art.
Figure 3:
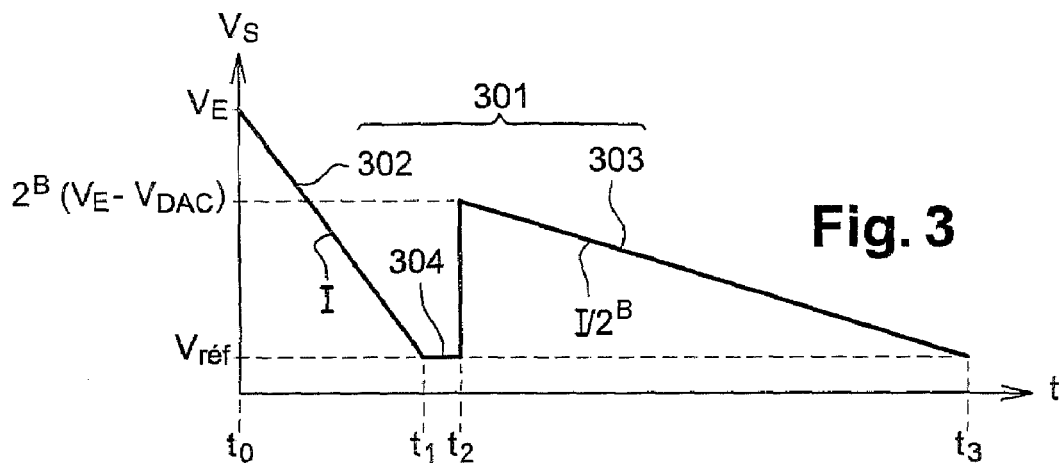
FIG. 3 is a schematic representation of a graph illustrating an embodiment of the method covered by the present invention.

FIG. 3 shows a timing chart showing the integration of a voltage over time. The x-axis therefore shows the time and the y-axis the voltage. In FIG. 3, the curve 301 thus shows the integration of an input voltage $V_E$, which begins with a first integration phase with a linear ramp 302 and terminates with a second integration phase with a linear ramp 303.

The integrated analog quantity here is a voltage. This analog quantity could however consist of another electrical quantity representative of the properties displayed by the elementary sensors of the detector during their interaction with the incident radiation. It could accordingly be the quantity of electric charges, for example.

The times $t_1$ and $t_2$ are separated by a plateau 304 during which the phase called reinitialization is carried out. This reinitialization phase serves to convert the first numerical value representing the most significant bits to an analog signal which is then separated from the analog quantity to be integrated $V_E$, then amplified before the second integration phase. This amplification is illustrated by the vertical line segment located at time $t_2$. As shown in FIG. 3, the gain of this amplification has the value here of the number 2 raised to the power B, where B corresponds to the number of most significant bits which served to code the first part of the integrated analog quantity $V_S$.

The first integration phase begins at time $t_0$ and terminates at $t_1$, synchronously with a reference clock (not shown), after the cancellation followed by the change in sign of the difference between the integrated voltage $V_S=V_E$ and a reference value $V_{ref}$.

The second integration phase begins at time $t_2$ and terminates at $t_3$ after the cancellation followed by the change in sign of the difference between the integrated voltage $V_S=2^B(V_E-V_{DAC})$ and the reference value $V_{ref}$. To facilitate the understanding of the graph, the level of the reference value $V_{ref}$ is indicated by a horizontal dotted line.

In the method of the invention, the two intervals $t_0$-$t_1$ and $t_2$-$t_3$ on the basis of which the two phases are carried out of the integration of an analog quantity, represented here by voltage, are separated by a time lag 304 during which no integration is carried out. This time lag is indicated by a horizontal plateau (at constant integrated voltage), symbolizing the absence of integration. According to the invention and as stated below, this time lag can be exploited to perform reinitialization operations in the various stages of the digitalization device of the present invention.

Figure 4:
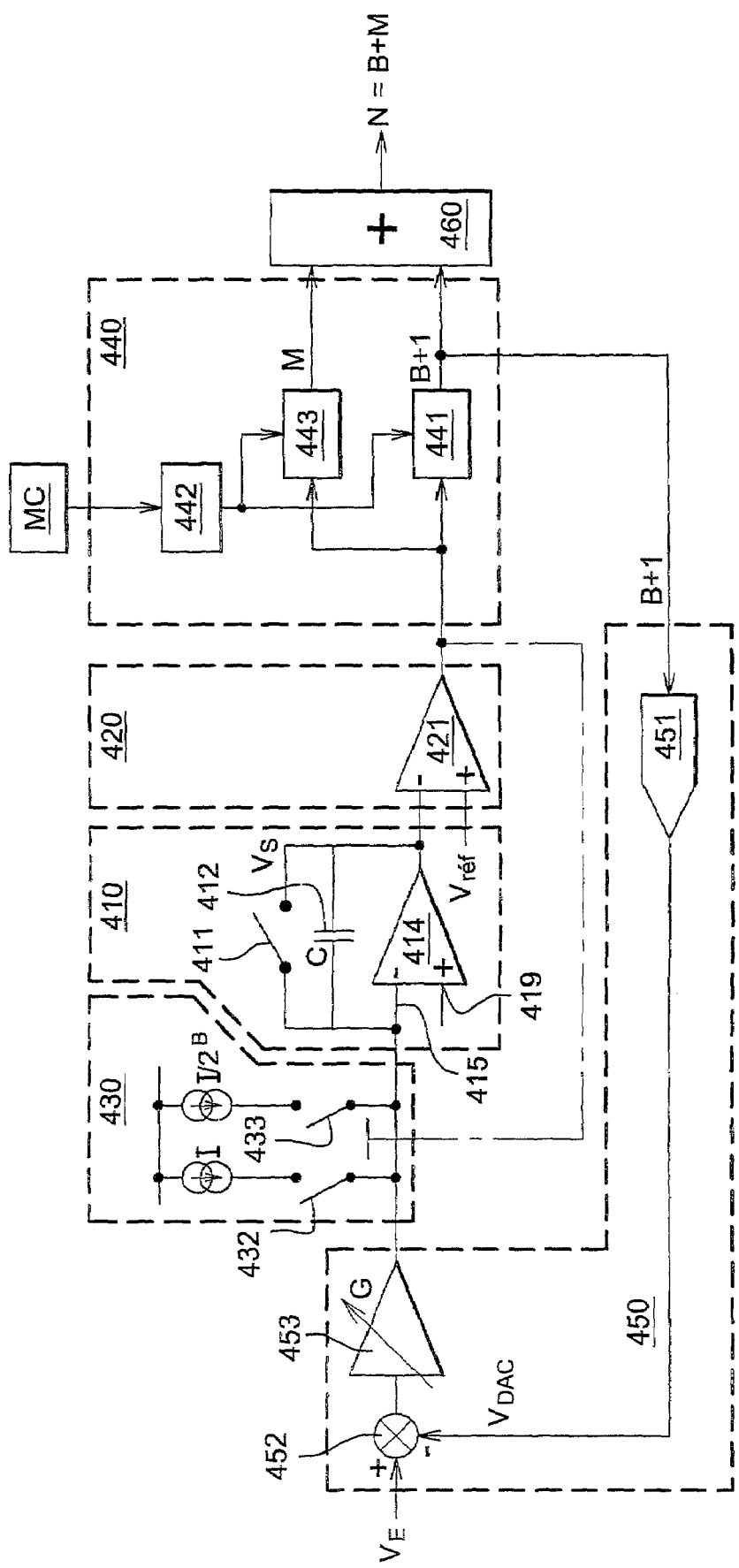
FIG. 4 is a schematic representation of a digitizing device according to an embodiment of the invention.

FIG. 4 shows such a conversion device comprising, according to the invention, an integrator stage 410, a differential or comparator stage 420, a discharge current control stage 430 and a counting and storage stage 440. These various stages fully perform the same functions as the corresponding stages of the converters of the prior art described in connection with FIG. 2.

Furthermore, the digitization device of the invention comprises an analog-to-digital reverse feedback circuit 450. This reverse feedback circuit 450 consists of a branch mounted in reverse feedback between the storage output 441 of the counter 442 and the input 415 of the integrator stage 410. As stated above, the reverse feedback circuit 450 comprises an analog-to-digital converter 451 intended for converting the first numerical value obtained after the first integration phase 302 to an analog signal representing the portion of the integrated analog quantity corresponding to the most significant bits (B+1).

The reverse feedback circuit 450 also comprises means 452 for subtracting the analog signal thereby converted from the analog quantity to be integrated $V_E$. Amplification means 453 are then provided in the reverse feedback circuit to multiply the signal resulting from the subtraction $[V_E-V_{DAC}]$ by a gain which has the value here $2^B$, or the number 2 raised to the power B. As stated above, this amplification is shown in the diagram in FIG. 3 by the vertical straight segment applied at time $t_2$. Previously, the analog-to-digital conversion by the converter 451 and the subtraction by the means 452 have taken place during the time 304 during which no integration is carried out. It should be observed that at time $t_0$, the voltage $V_E$ is directly applied to the input 415 of the integrator stage 410, that is, thanks to a set of switches (not shown), the circuits 452 and 453 are inoperative and carry out neither subtraction nor gain respectively.

The plateau 304 has a minimum duration, provided in the clock management device. However, its duration varies insofar as it depends on the value of $V_E$. In actual fact, the times $t_0$ and $t_2$ are fixed and known; on the other hand, the times $t_1$ and $t_3$ depend on $V_E$.

The integrator stage 410 is designed to integrate the input voltage $V_E$ from the elementary sensors during the first integration phase, and to integrate the residual voltage $2^B \cdot (V_E - V_{DAC})$ during the second integration phase. The differential stage 420 serves to compare the integrated voltage $V_S$ with the reference value $V_{ref}$ in order to determine the stopping of the first and second integration phases. The discharge current control stage 430 serves to control the integrator stage 410 in order to carry out in succession a high integration slope 302, and a low integration slope 303. Finally, the counting and storage stage 440 serves to store the number of pulses transmitted by the reference clock MC during each of the integration phases, and hence, to quantify or "digitize" the integrated voltage $V_E$. The times $t_0$ and $t_2$, which determine the beginning of the counts, are identical for all the analog-to-digital converters of the columns. Thus, the counter 442 may be common to all the analog-to-digital converters, and trips at $t_0$, then $t_2$.

In each analog-to-digital converter stage, the storage devices 441, 443 serve to acquire on the run, respectively the values at $t_1$ and at $t_3$, which may thus be different for each of the analog-to-digital converters of the columns. The common counter 442 makes a count at $t_{1max}$ and then $t_{3max}$ for each integration, in order to cover the entire dynamic range.

The integrator stage 410 of the converter of the invention is therefore similar to the integrator stage 210 of the converters of the prior art. Thus, the operational amplifiers 214 and 414 are connected to an electrical reference by their non-reversing input, respectively 219 and 419. This reference is specific to the dynamic range and to the technology of the readout circuit; it has no influence on the conversion system.

Figure 2:
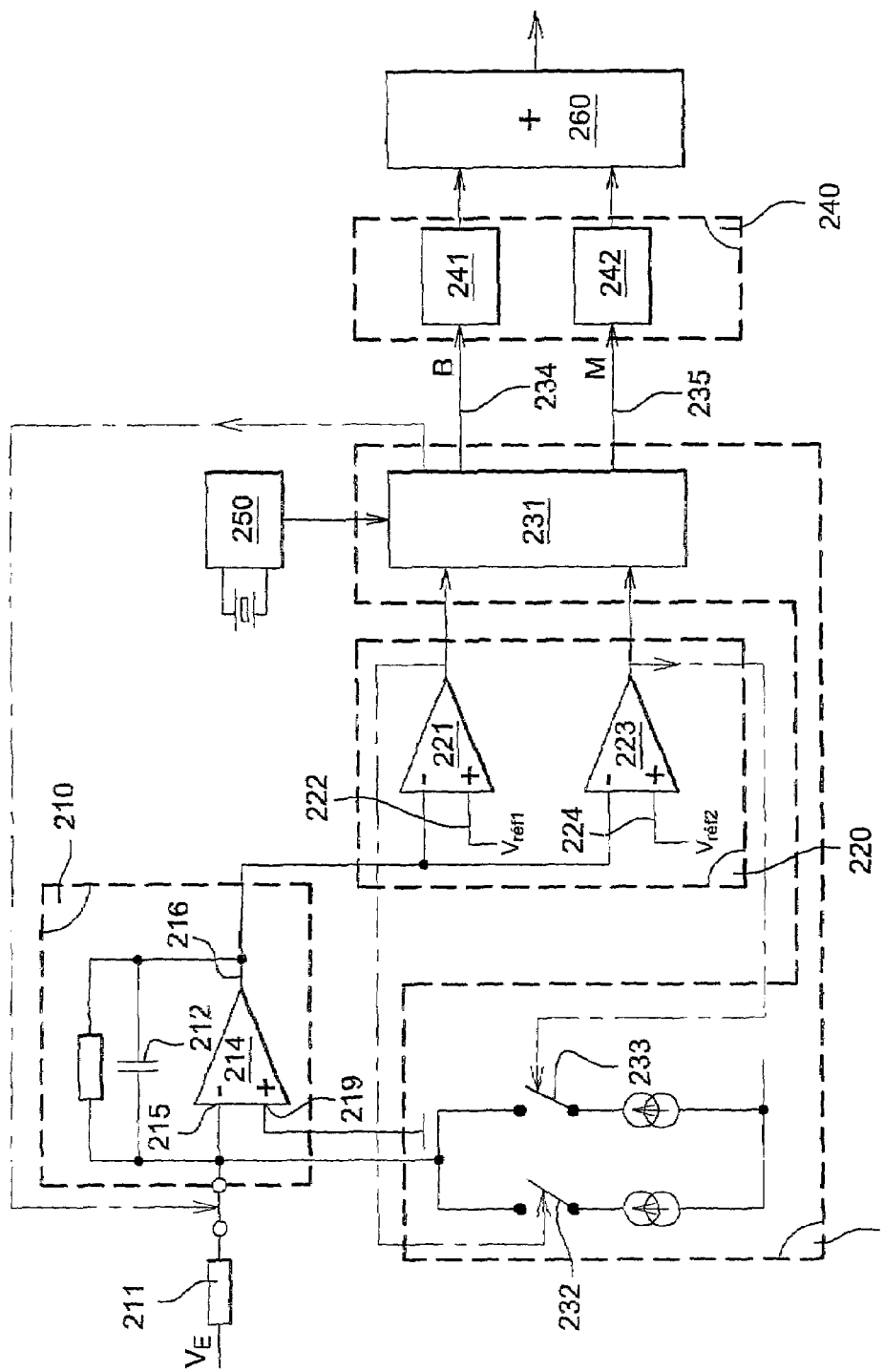
FIG. 2 is a schematic representation of an analog-to-digital conversion device according to an embodiment of the prior art. This figure has already been described in relation to the prior art.

On the other hand, contrary to the comparator stage shown in FIG. 2, the differential stage of the converter in FIG. 4 only has a single comparator assembly, which is equipped with an operational amplifier 421. The reversing input of the operational amplifier 421 receives the integrated voltage $V_S$ and its non-reversing input is connected to a circuit delivering the reference voltage $V_{ref}$. The method for generating this reference voltage being carried out according to the prior art, it is not described in detail here.

In consequence, the comparator stage 420 occupies a smaller space than that occupied by the comparator stage of the prior art 220. Furthermore, it consumes substantially lower electric power. Accordingly, the temperature rise that occurs in these circuits is substantially lower than the temperature rise that occurs in the circuits of the integrator stage 220. Moreover, the material and production costs of the differential stage 420 are lower than those of the stage 220.

The discharge current control stage 430 acts via switches 432 and 433, thereby selecting one or the other of the power sources I and $I/2^B$ discharging a capacitor C mounted between the output and the reversing input of the integrator stage 410. In doing so, the control stage 430 determines the gain of each of the two integration phases 302 and 303, a gain which, in a manner known per se, is inversely proportional to the capacitance of the integrator capacitor C.

The discharge control stage may however be provided by a voltage ramp associated with a capacitance, rather than a current device. These two techniques are perfectly known to a person skilled in the art, and each has its own advantages and drawbacks. They do not alter the principle of the invention. The current principle is selected here for the clarity of the description.

For convenience, to distinguish between the electrical connections directly involved in the integration of the control link for the switches 432 and 433 transmitted by the control stage 430, the latter have been plotted in mixed lines. In actual fact, there is obviously no break in the links 432 and 433.

The counting stage 440 comprises two memory elements 441 and 443. The counter 442, which may be common to a plurality of analog-to-digital converters, is itself fed with pulses by a reference clock MC. The output of the counter 442 is connected to the memories 441, 443 in order to write therein its current value. The memories 441, 443 may be a locking circuit memory or "latch". They are suitable for respectively storing a number of B+1 bits corresponding to the most significant bits, and a number of M bits corresponding to the least significant bits.

In operation, the capacitor C is charged at the voltage $V_E$, then discharged under a current I. The integrator stage 410 thereby carries out the first integration phase 302 of the input voltage $V_E$, until the difference measured by the comparator stage 420 between the integrator voltage $V_S$ and the reference voltage $V_{ref}$ has changed sign. This difference is measured by the operational amplifier 421, which simultaneously delivers a signal to the discharge current control stage 430 and to the counting stage 440, marking the end of this first integration phase 302.

At the end of this first integration phase, the comparator stage 420 transmits a stop signal to the counting stage 440 so that it stores the numerical value integrated in the form of a binary number corresponding to the most significant bits. The counter 442 therefore has the function of "timing" the integration phases. For this purpose, it counts by incrementation the pulses delivered by the reference clock MC, then transmits the number thus incremented to the memory 441 of the counting stage 440 via a conventional busbar for this type of structure.

When the current value of the counter 442 has been recorded in the memory 441, the counter 442 continues its counting up to $2^{B+1}$ bits; it must then be reset to zero from time $t_2$ in order to include the duration of the second integration phase, the one corresponding to the least significant bits. The second integration phase is again carried out by the integrator stage 410 until the date when the integrated voltage $V_S$ reaches or, in practice, exceeds the reference value $V_{ref}$.

In FIG. 3, this date is denoted $t_3$. It corresponds to the time when the current value of the counter 442 is recorded in the memory 443 of the least significant bits.

According to the invention, during the reinitialization phase, the capacitor C is charged with a voltage $2^B \cdot [V_E - V_{DAC}]$. After this reinitialization, the control stage 430 switches the switches 432 and 433 in order to activate and/or deactivate the current sources I and $I/2^B$. This switching enables the integrator stage 410 to discharge the capacitor C under a low intensity current $I/2^B$ during the second integration phase 303. This serves to carry out a second, relatively slower, therefore accurate, integration phase. A high accuracy is thereby obtained for the least significant bits.

Furthermore, the amplification for the gain $2^B$ of the residue to be integrated $[V_E - V_{DAC}]$ therefore serves to decrease the constraint weighing on the accuracy of the analog-to-digital converter 451. In fact, the maximum error during the second integration is the value of the total dynamic range divided by the gain $2^{N-B}$, whereas it would have the value of the total dynamic range divided by the gain $2^N$ for a conversion device of the prior art, where N is the number of bits necessary for coding the maximum voltage integrable by the conversion device, which actually corresponds to the total dynamic range.

Figure 5:
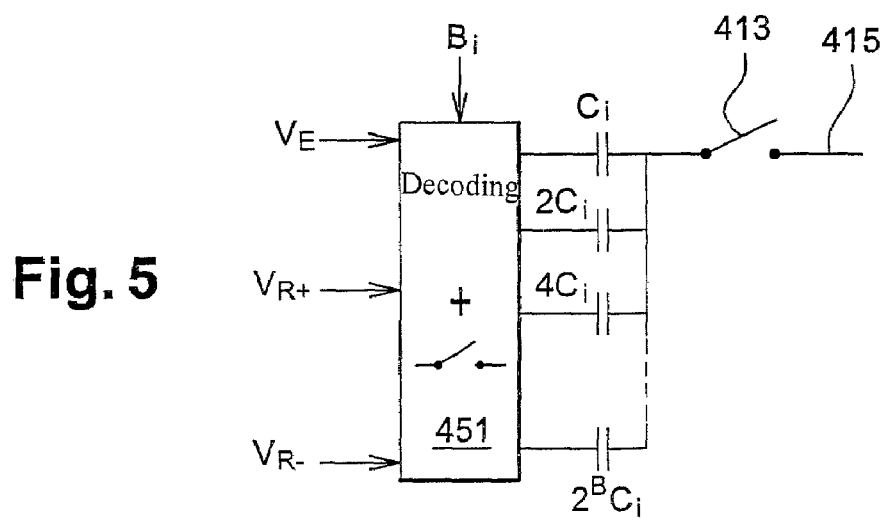
FIG. 5 is a schematic representation showing details of the reverse feedback circuit of the digitalization device shown in FIG. 4.

This advantage therefore serves to use an analog-to-digital converter 451 as shown in FIG. 5. Such a converter comprises a system of switched capacitances $C_i$ and a system for decoding the switches. The pairing of the capacitances $C_i$ determines the accuracy of the gain and the output voltage $V_{DAC}$ of the converter. This voltage $V_{DAC}$ is a function of $V_{R+}$ and of $V_{R-}$.

Thus, the most significant bits B of the first integration phase command, by decoding, the capacitance selection switches, which will be connected, according to the value of B, at $V_E$ and/or $V_{R+}$ and/or $V_{R-}$, during the phase 304.

Then, the switch 413 is closed at time $t_2$, and the ratio of the various capacitances $C_i$ of the device shown in FIG. 5 with the capacitance 412 of the integrator, serves to carry out a triple operation symbolized in the reverse feedback circuit 450:

analog-to-digital conversion, hence generation of $V_{DAC}$ (by the selection of $V_{R+}/V_{R-}$ with the capacitances associated with the decoding and with the switches);

subtraction $V_E - V_{DAC}$ by the combination of capacitances;

gain $2^B$ by the ratio of the capacitances $C_i$ in FIG. 5 with the capacitance C 412 of the integrator at time $t_2$.

Thus, a single operational amplifier 414 is used to carry out the functions of the reverse feedback branch 450 and the integrator stage 410.

The pairing of the capacitances $C_i$ is commensurately more difficult to obtain since the installation area of the electronic components is limited (the repetition step between pixels in this case). In consequence, the decrease of the requirement of accuracy of the converter by the gain $2^B$ commensurately reduces this installation constraint. The dimensioning of the converter results from a compromise between the number of bits B defining the gain and the area occupied by the capacitances $C_i$. The equilibrium existing between the consumption of the analog-to-digital converter 451 and the passband of the amplifier 414, which is a function of the gain G applied, is also taken into account.

The second integration phase has a slope 303, of which the slope factor is lower than the slope displayed by the first integration phase 302. In fact, the analog signal transmitted by the reverse feedback circuit is amplified by the gain $2^B$, while the discharge current of the capacitor C of the integrator stage 410 has the value $I/2^B$, that is, the discharge current I of the first integration 302 divided by $2^B$.

As for the analog-to-digital converter 451, the accuracy required of the comparator stage 420 may be reduced by the gain $2^B$, which amplifies the slope 303 of the second integration phase. On the contrary, in the conversion devices of the prior art, the second slope 103 is much lower and requires more accurate digitalization.

For both phases, advantageously, a correction is made of the voltage offset by tripping the counter 442 one clock half-period after the start of the integration. This offset during the tripping of the counter 442 is then compensated during the summation of the last most significant bit B+1 with the first least significant bit M. This correction by one digit of the voltage offset therefore consists in systematically adding a numerical offset during the first integration. In fact, the offset is created by the lag of a half-period made during the tripping of the counter 442. This principle is known to a person skilled in the art, particularly in converters of the "flash-pipeline" type.

At the end of the second integration phase, the comparator stage 420 commands the storage of a second numerical value M (coded on M bits) in the memory 443, corresponding to the least significant bits, that is, to the residual part of the integrated voltage. The means 460 then carry out a (binary) addition of the numerical values M and B+1 issuing from the two integration phases, thereby making a correction of the voltage offset, the value B+1 having been stored in the memory 441. The resulting number N=B+M coding this sum comprises a number of bits N suitable for coding the maximum voltage $V_E$ to be integrated.

The counter 442 is therefore dimensioned to quantify the M least significant bits, which are more numerous than the most significant bits B (longer integration time), which is summarized by the equation M>B+1. Such a counter 442 is therefore suitable for quantifying the B most significant bits of the first integration phase, and then, after its reinitialization (zero reset), the M least significant bits, during the second integration phase.

Thus, the structure of the comparator stage 420 with a single operational comparator amplifier 421, allows for savings in terms of production, cost, power consumption and space necessary for installation of the analog-to-digital conversion device.

Furthermore, the use of a single operational amplifier 421 procures another advantage over the detectors of the prior art. It serves in effect to perform the comparison function by canceling the voltage offset or differential error voltage inherent in the use of an operational amplifier.

In fact, in practice, it is known that the output of a voltage comparator operational amplifier switches when the voltage difference between the two inputs corresponds to a certain offset voltage. In the ideal case, this voltage offset is zero. In practice, for technological reasons, it is difficult to control this offset voltage, which is consequently not zero.

In the case of a converter of the prior art, the differential error is the difference between the voltage offsets of the two operational amplifiers 221 and 223. It necessarily leads to a costly offset cancellation system, so that the comparator of the second slope does not trip before that of the first slope. On the contrary, in the case of the converter of the invention, the voltage offset is the same for the two integration phases, because it is the same operational amplifier 421 that measures the difference. In consequence, the voltage offset during the second integration phase compensates for that of the first integration phase and the differential error is cancelled. The converter of the invention is therefore more accurate than the converters of the prior art.

Other embodiments of the method or device of the invention are feasible without necessarily going beyond the scope of said invention. In particular, the conversion principle of the invention can be extended without major difficulty to converters of the multiple ramp and multiple slope type.

This invention finds applications in particular in the field of matrix detectors, which include one-dimensional detectors ("strips"), regardless of the incident electromagnetic radiation and the type of detectors employed. This invention finds an application more particularly in the field of matrix detectors, that is two-dimensional detectors, of infrared radiation.

The invention claimed is:

1. A method for digitizing an analog quantity ($V_E$) produced by a detector of electromagnetic radiation, in particular infrared radiation, said detector comprising a matrix of juxtaposed elementary sensors, whose interactions with said radiation generate said analog quantity ($V_E$), the method comprising the steps consisting, for each line or for each column of said matrix:
   - in carrying out a first integration phase of said analog quantity over a first time interval using an integrator stage;
   - in ordering the interruption of said first integration phase via a comparator stage whereof one input is connected to the output of said integrator stage and the other input to a reference circuit delivering a reference value ($V_{ref}$);
   - in converting the analog quantity thereby integrated ($V_S$) to a first numerical value (B) via a binary counter and a memory element connected to the output of said comparator stage;
   - in storing said first numerical value (B) in the form of a first binary number representing the most significant bits;
   - wherein said method further comprises the steps consisting, for each line or for each column of said matrix:
     - in converting said first numerical value (B) thereby obtained to an analog signal ($V_{DAC}$) similar to the analog quantity to be digitized ($V_E$) via an analog-to-digital converter;
     - in subtracting said analog signal ($V_{DAC}$) from said analog quantity to be digitized ($V_E$);
     - in amplifying the signal ($V_E-V_{DAC}$) resulting from said subtraction with a gain representing said first numerical value (B);
     - in carrying out a second integration phase using said integrator stage, in order to produce a second numerical value (M) proportional to the analog signal thereby amplified $2^B \cdot (V_E-V_{DAC})$ and forming a second binary number representing the least significant bits;
     - in adding said first (B) and second (M) numerical values in order to form a number (N) representative of said analog quantity to be integrated ($V_E$).

2. The method as claimed in claim 1, wherein said gain ($2^B$) has the value of the number two raised to the power of said first numerical value.

3. The method as claimed in claim 2, wherein said first numerical value (B) is increased by a unit before said conversion step, in order to correct the voltage offset presented by the comparator stage.

4. The method as claimed in claim 1, said integrator stage comprising a capacitor (C), wherein said method further comprises the steps consisting:
   - in charging said capacitor (C) with the analog quantity to be converted;
   - in discharging said capacitor (C) under a constant high intensity current (I) during the first integration phase;
   - in recharging said capacitor (C) with a voltage ($V_E-V_{DAC}$) depending on the difference between the analog quantity to be integrated ($V_E$) and the result of the first conversion phase;
   - in discharging said capacitor (C) under a constant low intensity current ($I/2^B$) during the second integration phase.

5. The method as claimed in claim 1, wherein the reference value ($V_{ref}$) is determined as a function of the sensitivity range of the detector.

6. A device for digitizing an analog quantity ($V_E$) produced by a detector of electromagnetic radiation, in particular infrared radiation, said detector comprising a matrix of juxtaposed elementary sensors, whose interactions with said radiation generate said analog quantity, said device comprising, the method comprising the steps consisting, for each line or for each column of said matrix:
   - an integrator stage comprising an operational amplifier, at least one capacitor (C) and an electrically controllable switching device connected in parallel between the output and the reversing input (−) of said operational amplifier, said integrator stage being suitable for integrating said analog quantity ($V_E$) when said switching device is open;
   - a comparator stage comprising a single operational amplifier, and whereof the reversing input (−) is connected to the output of said integrator stage and the other input is connected to a reference circuit delivering a reference value ($V_{ref}$);
   - a binary counter connected to two memory elements, controlled by the output of said comparator stage and suitable for determining a first numerical value (B) proportional to said integrated analog quantity ($V_S$);
   - means for storing said first numerical value (B);
   - a reverse feedback circuit, whereof the input is connected to the output of said memory element and comprising:
     - a converter suitable for converting said first numerical value (B) to an analog signal ($V_{DAC}$) similar to said analog quantity ($V_E$),
     - means for subtracting said analog signal ($V_{DAC}$) from said analog quantity ($V_E$),
     - and means for amplifying the signal ($V_E-V_{DAC}$) resulting from said subtraction with a gain ($2^B$) depending on the number B of bits of said first numerical value,
   - the output of said reverse feedback circuit being connected to the input of said integrator stage, so that the latter produces a second numerical value (M) proportional to the analog signal thereby amplified ($2^B \cdot [V_E-V_{DAC}]$);
   - means for adding said first (B) and second (M) numerical values in order to form a number (N) representative of said analog quantity to be integrated ($V_E$).

7. The device as claimed in claim 6, wherein the binary counter is offset and common to a plurality of analog-to-digital converters placed on each column.

8. The device as claimed in claim 6, wherein the storage means comprise two locking circuit memories connected to the output of the binary counter.

9. The device as claimed in claim 6, wherein said reverse feedback circuit comprises a decoding system, suitable for carrying out the analog-to-digital conversion function, and a plurality of stores mounted in parallel and individually switchable using switches.

10. A detector of electromagnetic radiation, in particular infrared, comprising a matrix of juxtaposed elementary sensors, wherein it comprises a device as claimed in claim 6.

11. A detector of electromagnetic radiation as claimed in claim 10, wherein the matrix has a single line or a single column.

12. A detector of electromagnetic radiation as claimed in claim 10, wherein the elementary sensors are bolometers.

* * * * *